United States Patent [19]

Maeda

[11] Patent Number: 4,643,777
[45] Date of Patent: Feb. 17, 1987

[54] METHOD OF MANUFACTURING A SEMICONDUCTOR DEVICE COMPRISING RESISTORS OF HIGH AND LOW RESISTANCES

[75] Inventor: Takeo Maeda, Tokyo, Japan
[73] Assignee: Kabushiki Kaisha Toshiba, Japan
[21] Appl. No.: 683,479
[22] Filed: Dec. 19, 1984
[30] Foreign Application Priority Data Dec. 20, 1983 [JP] Japan ............................... 58-238805

[51] Int. Cl.$^4$ ........................................ H01L 21/283
[52] U.S. Cl. .................................... 148/1.5; 148/188; 148/DIG. 35; 148/DIG. 105; 148/DIG. 147; 29/571; 29/578; 29/576 B; 29/589
[58] Field of Search ..................... 29/571, 578, 576 B, 29/589, 591; 148/1.5, 186, 188, 189, DIG. 35, DIG. 19, DIG. 105, DIG. 147; 357/65, 71 S

[56] References Cited

U.S. PATENT DOCUMENTS

| | | | |
|---|---|---|---|
| 3,484,308 | 12/1969 | Lesk | 148/DIG. 35 X |
| 3,566,518 | 3/1971 | Brown et al. | 148/DIG. 105 X |
| 3,775,192 | 11/1973 | Beale | 148/1.5 |
| 3,777,364 | 12/1973 | Schinella et al. | 148/DIG. 147 X |
| 3,909,319 | 9/1975 | Fujiwara et al. | 148/187 |
| 3,918,149 | 11/1975 | Roberts | 148/DIG. 147 X |
| 3,976,512 | 8/1976 | De Nova et al. | 148/DIG. 37 X |
| 4,025,364 | 5/1977 | Smith | 148/1.5 |
| 4,080,718 | 3/1978 | Richman | 29/571 |
| 4,080,719 | 3/1978 | Wilting | 148/DIG. 147 X |
| 4,141,022 | 2/1979 | Sigg et al. | 357/23 |
| 4,173,063 | 11/1979 | Knieykamp et al. | 29/571 |
| 4,224,733 | 9/1980 | Spadea | 29/571 |
| 4,285,761 | 8/1981 | Fatula et al. | 148/DIG. 147 X |
| 4,290,187 | 9/1981 | Stein | 29/578 X |
| 4,297,782 | 11/1981 | Ito | 29/571 |
| 4,362,597 | 12/1982 | Fruser et al. | 357/715 X |
| 4,376,658 | 11/1983 | Sigusch | 29/576 B X |
| 4,451,328 | 5/1984 | Dubois | 357/715 X |

FOREIGN PATENT DOCUMENTS

| | | | |
|---|---|---|---|
| 0067361 | 1/1978 | Japan | 29/576 B |
| 0151334 | 11/1980 | Japan | 29/576 B |
| 0077253 | 10/1983 | Japan | |

OTHER PUBLICATIONS

Kircher et al. "Fabricating a Gate Field-Effect Transistor" in IBM Technical Disclosure Bulletin, vol. 13, No. 3, Aug. 70, pp. 646-648.
JE0017393, Jun. 1978, Japan, Abstract Only.
Howard "Gate for Mos Devices: . . . " IBM Tech Disc Bull, vol. 21, No. 7, Dec. 1978, pp. 2811-2813.
Laibowitz et al. "Fabrication of Using . . . " IBM Tech Dise Bull, vol. 21, No. 12, May 1979 pp. 5051-5052.
Dash et al., "Method to Fabricate Polysilicon or Polycide Buried Contacts . . . " IBM Tech Disc Bull, vol. 24, No. 6, Nov. 1981, pp. 2863-2866.
Choi et al. "Improved Salicide Process . . . " IBM Tech Disc Bull, vol. 27, No. 7B, Dec. 1984, pp. 4402-4404.
Lien et al. "Electrical Properties of Thin $Co_2Si$, $CoSi$, and $CoS_2$ . . . " J. Elec Mat. vol. 13, No. 1, 1984, pp. 95-105.
Shibata et al., "An Optimally Designed Process for Submicron MOSFETS," IBM, p. 647-650, 1981.
Okabayashi et al., "Low Resistance MOS Technology Using Self-Aligned Refractory-Silicidation," IEDM, pp. 556-559, 1982.

Primary Examiner—Brian E. Hearn
Assistant Examiner—Tuan Quach
Attorney, Agent, or Firm—Finnegan, Henderson, Farabow, Garrett & Dunner

[57] ABSTRACT

There is disclosed a method of manufacturing a semiconductor device comprising the steps of forming a polysilicon film on a semiconductor substrate through an oxidation film, forming a mask of a predetermined pattern on the polysilicon film, forming a molybdenum film on the polysilicon film, and silicifying those regions of said molybdenum film not covered by the mask so that a structure of the uncovered molybdenum film regions and those regions of the polysilicon film located under the uncovered molybdenum regions have low resistance, while a region of the molybdenum film covered by the mask has high resistance.

12 Claims, 11 Drawing Figures

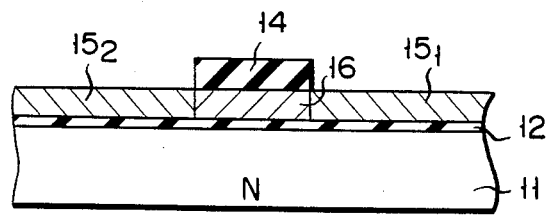
F I G. 2B
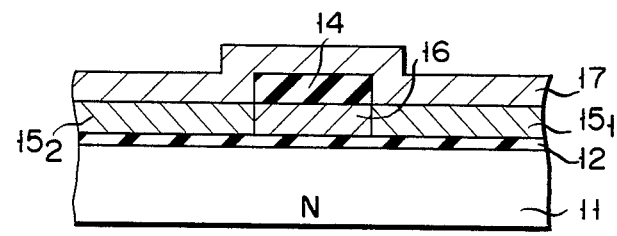
F I G. 2C
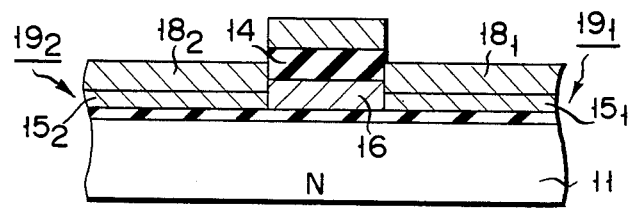
F I G. 2D
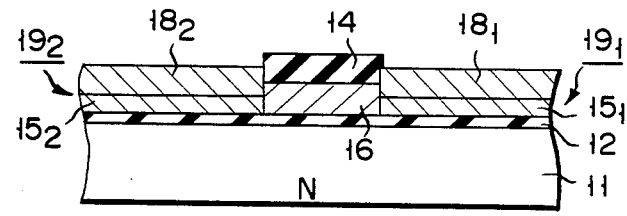
F I G. 2E
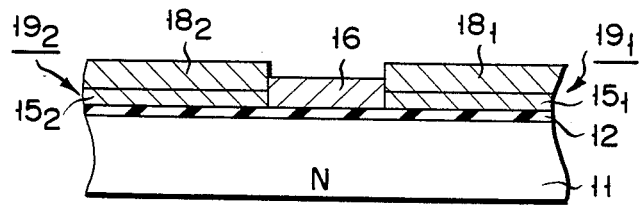
F I G. 2F 4,643,777

METHOD OF MANUFACTURING A SEMICONDUCTOR DEVICE COMPRISING RESISTORS OF HIGH AND LOW RESISTANCES

BACKGROUND OF THE INVENTION

This invention relates to a method of manufacturing a semiconductor device, in particular, a semiconductor device comprising resistors of high and low resistances.

There has widely been used a semiconductor device comprising resistors of high and low resistances made of polysilicon. Such a semiconductor device has been manufactured by the following method.

Process 1 (FIG. 1A)

A gate oxidation film 2 is formed on an element forming region of a semiconductor substrate 1 where a semiconductor element is to be later formed. The element forming region is defined or surrounded by a field oxidation film (not shown). A polysilicon film 3 of a high resistance is formed over the major surface of the structure. After that, a patterned oxidation film 4 is formed on that region of the polysilicon film 3 which constitutes a resistive region of a high resistance.

Process 2 (FIG. 1B)

An impurity ion is implanted or thermally diffused into the polysilicon film 3 using the oxidation film 4 as a mask, thereby forming resistive regions $5_1$, $5_2$ of a low resistance at the regions of the polysilicon film 3 not covered by the mask 4. A region of the polysilicon film 3 covered by the mask 4 forms a resistive region 6 of a high resistance.

Process 3 (FIG. 1C)

The oxidation mask 4 is removed. Thereafter, a metal film 7 is formed over the major surface of the structure.

Process 4 (FIG. 1D)

A patterned photoresist film 8 is formed on those regions of the metal film 7 which correspond to the polysilicon resistive regions $5_1$, $5_2$ of low resistance. The exposed region of the metal film 7 is etched using the photoresist film 8 as a mask, thereby leaving those regions $7_1$, $7_2$ of the metal film 7 locating on the resistive polysilicon regions $5_1$, $5_2$ of low resistance 3.

Process 5 (FIG. 1E)

The photoresist mask 8 is removed. The metal region $7_1$ and polysilicon resistive region $5_1$ constitute a resistor $9_1$ of low resistance, and the metal region $7_2$ and polysilicon resistive region $5_2$ also constitute a resistor $9_2$ of low resistance. The polysilicon region 6 constitutes a resistor 6 of high resistance.

Through the processes above, a semiconductor device comprising resistors of high and low resistance made of polysilicon is manufactured.

However, the prior art manufacturing method has the following problems.

1. The manufacturing method comprises the step of forming the photoresist film 8 and selectively etching the metal film 7 using the photoresist film 8 as a mask. This complicates the manufacturing operation.

2. The mask films 4 and 8 are formed at separate steps. Therefore, the edges of the masks 4, 8 tend not to align with each other. In order to compensate a masking displacement, the semiconductor wafer is required to have a margin when the mask films 4, 8 are formed. This decreases the packing density of the semiconductor elements to be formed in the wafer.

SUMMARY OF THE INVENTION

This invention has been achieved under the above described circumstances and has as its object to provide a method of manufacturing in a simple operation a semiconductor device of a high packing density.

According to the invention, there is provided a method of manufacturing a semiconductor device comprising:

a step of forming a film of a high resistance containing silicon on a semiconductor substrate;

a step of forming a mask of a predetermined pattern on said silicon containing film;

a step of forming a metal film on said silicon containing film; and

A step of silicifying said metal film so that a structure of said metal and that region of said silicon containing film which is adjacent to said metal film has a low resistance, while that region of said silicon containing film which is adjacent to said mask has a high resistance.

BRIEF DESCRIPTION OF THE DRAWINGS

FIGS. 2A to 2F show cross sections of a semiconductor device during the manufacturing processes of the method according to an embodiment of the invention.

DETAILED DESCRIPTION OF THE PREFERRED EMBODIMENT

There will now be described a manufacturing method of a semiconductor device according to an embodiment of the invention with reference to FIGS. 2A to 2F.

Figure 1A:
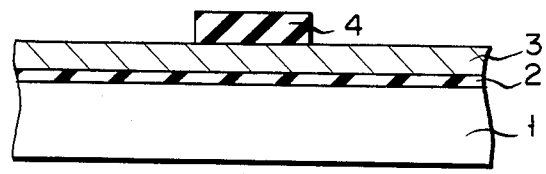
FIGS. 1A to 1E show cross sections of a semiconductor device during the manufacturing processes of the prior art method.
Figure 1B:
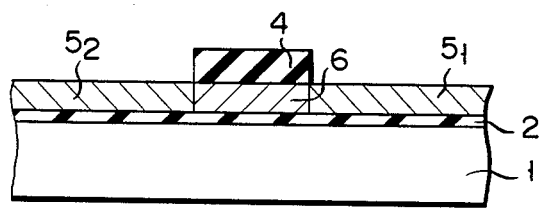
Figure 1C:
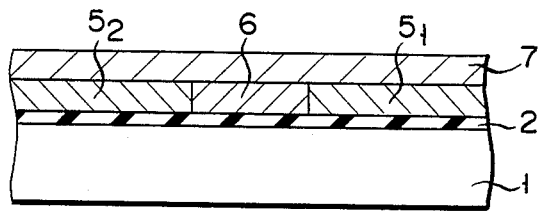
Figure 1D:
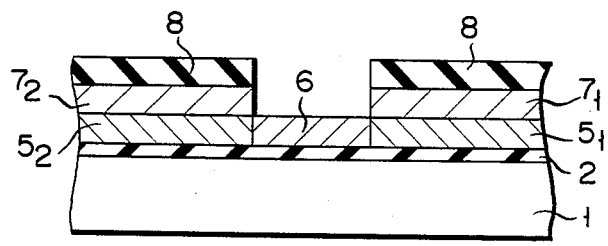
Figure 1E:
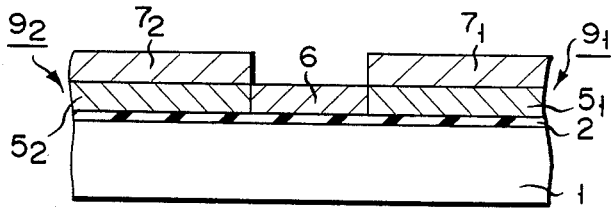
Figure 2A:
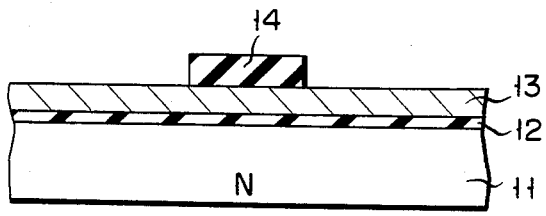

Process 1 (FIG. 2A)

An N conductivity silicon substrate 11 of a specific resistivity of about 1 to 10 $\Omega$·cm was prepared. A field oxidation film (not shown) of about 2000 to 5000 Å in thickness was formed on a major surface of the substrate 11. The field oxidation film has a predetermined pattern forming a patterned hole. A region of the semiconductor substrate defined or surrounded by the patterned hole of the field oxidation film forms an element forming region where a semiconductor element is to be later formed. A gate oxidation or insulation film 12 of about 100 to 4000 Å in thickness was formed on the element forming region. A polysilicon film 13 of about 200 to 5000 Å in thickness having a high resistance was formed over the major surface of the structure by using the LPCVD (low pressure chemical vapour deposition) technique. An amorphous silicon film or a single crystal silicon film may be formed in place of the polysilicon film 13. Thereafter, $SiO_2$ was deposited over the polysilicon film 13, thereby forming thereon an $SiO_2$ film of about 1000 to 6000 Å in thickness by using the CVD (chemical vapour deposition) or thermal oxidation technique. Next, the $SiO_2$ film was patterned, thereby forming an $SiO_2$ mask 14 on a predetermined region of the polysilicon film 13 constituting a high resistive region or element.

Process 2 (FIG. 2B)

A phosphor ion was implanted into the polysilicon film 13 using the $SiO_2$ film 14 as a mask, with a dose quantity of about $1 \times 10^{15}$ cm$^{-2}$ and an accelerating voltage of about 50 KeV, thereby forming low resistive regions or elements $15_1$, $15_2$ in the polysilicon film 13. The low resistive regions $15_1$, $15_2$ are those regions of the polysilicon film 13 not covered by the SiO$_2$ mask 14. A region of the polysilicon film 13 covered by the SiO$_2$ mask 14 forms a high resistive region or element 16. That is, the high resistive region 16 and low resistive regions $15_1$, $15_2$ were formed in self-alignment with each other by using the SiO$_2$ mask 14. Arsenic may be used in place of phosphor. A thermal diffusion process may be used in place of the ion implanting process. When a thermal diffusion process is used, a preferable condition is that an impurity diffusion atmosphere is POCl$_3$, a heating temperature is 900° C. and a heating time is 30 minutes.

Process 3 (FIG. 2C)

A molibdenum film 17 of about 100 to 2000 Å in thickness was formed over the major surface of the structure using a sputter technique.

Process 4 (FIG. 2D)

Next, the structure was subjected to a thermal treatment of about 600° to 1000° C. in temperature. As a result, the low resistive regions $15_1$, $15_2$ of the polysilicon film 13 and the molybdenum film 17 were alloyed at those regions adjacent to each other so that molybdenum silicide regions $18_1$, $18_2$ were formed at the adjacent regions. At this time, that region of molybdenum film 17 locating on the SiO$_2$ mask 14 was unchanged. The regions $15_1$ and $18_1$ constitute a resistor of a laminated film structure $19_1$ of a low resistance. The regions $15_2$ and $18_2$ also constitute a resistor of a laminated film structure $19_2$ of low resistance.

Process 5 (FIG. 2E)

The region of the molybdenum left on the SiO$_2$ mask 14 was removed by an etching technique.

Process 6 (FIG. 2F)

The SiO$_2$ mask 14 was removed.

Through the manufacturing processes above, a semiconductor device comprising resistors formed of polysilicon of low and high resistances was manufactured. When measuring the specific resistivity values of the resistors of low and high resistances of the devices manufactured according to the embodiment, the resistors $19_1$, $19_2$ of low resistance had about 1 to 10 $\Omega/\square$, and the resistors 16 of high resistance had about 1 to 100 G$\Omega/\square$.

With the manufacturing method described above, as will clearly be understood, masking process was only once carried out in which the mask 14 was formed. This simplifies the manufacturing operation of the device. Also with the above manufacturing method, high and low resistive regions were formed in self-alignment with each other by using the mask 14. This makes it unnecessary for a semiconductor wafer to have a margin for compensating a making displacement, thus enhancing the packing density of the semiconductor elements to be formed in the wafer.

This invention is not limited to the embodiment described above. It is obvious that some other embodiments or modifications may be thought of by a person skilled in the art within the spirit of the invention. For example, with the embodiment described above, a phosphor ion was implanted into the polysilicon film 13, thereby forming the resistor element of low resistance comprising the laminated film structure of the polysilicon film of low resistance and the molybdenum silicide film. However, the ion implantation may be omitted. In that case, the resistor element of low resistance comprises a laminated film structure of a polysilicon film of high resistance and molybdenum silicide film. Also with the embodiment above, the phosphor ion implantation into the polysilicon film 17 was carried out before forming the molybdenum film 17. However, the phosphor ion implantation may be carried out after forming the molybdenum film 17. The phosphor ion implantation may also be carried out immediately after the alloying process of the polysilicon film 15 and molybdenum film 17. It is preferable that the implantation process is carried out before forming the molybdenum film 17 as in the embodiment above. Because, in that case, the silicifying or alloying are preferably effected. Also with the embodiment above, the SiO$_2$ film 14 was formed on the semiconductor wafer 11 through the gate oxidation film 12 and polysilicon film 13. Also with the embodiment above, the film 17 was made of molybdenum. However, instead of molybdenum, a high melting point metal such as titanium, tantalum or tungsten, or a noble metal such as platinum or palladium may be used. Cobalt or aluminum may also be used.

As clearly understood from the above, in the manufacturing method of the invention, the number of necessary processes was reduced. Therefore, the manufacturing operation was simplified. Also with the manufacturing method of the invention, the high and low resistive elements were formed in self-alignment with each other. Therefore, the packing density of the semiconductor elements was enhanced.

What is claimed is:

1. A method of manufacturing a semiconductor device comprising:
   a step of forming a film of a high resistance containing silicon on a semiconductor substrate;
   a step of forming a mask of a predetermined pattern on said silicon containing film;
   a step of forming a metal film on said silicon containing film; and
   a step of silicifying said metal film so that a structure of said metal film and that region of said silicon containing film which is adjacent to said metal film has a low resistance, while that region of said silicon containing film which is adjacent to said mask has a high resistance.

2. A manufacturing method according to claim 1, wherein said silicon containing film is formed over said substrate through an insulation film formed on said substrate.

3. A manufacturing method according to claim 1, which further comprises, following said mask forming step, a step of implanting an impurity ion into said silicon containing film.

4. A manufacturing method according to claim 1, which further comprises, following said metal film forming step, a step of implanting an impurity ion into said silicon containing film through said metal film.

5. A manufacturing method according to claim 1, which further comprises, following said silicifying step, a step of implanting an impurity ion into said silicon containing film through said metal film.

6. A manufacturing method according to claim 1, which further comprises, following said mask forming step, a step of thermally diffusing an impurity ion into said silicon containing film.

7. A manufacturing method according to claim 1, which further comprises, following said metal film forming step, a step of thermally diffusing an impurity ion into said silicon containing film through said metal film.

8. A manufacturing method according to claim 1, which further comprises, following said silicifying step, a step of thermally diffusing an impurity ion into said silicon containing film through said metal film.

9. A manufacturing method according to claim 1, wherein said silicon containing film is a polysilicon film.

10. A manufacturing method according to claim 1, wherein said silicon containing film is an amorphous silicon film.

11. A manufacturing method according to claim 1, wherein said silicon containing film is a single crystal silicon film.

12. A manufacturing method according to claim 1, wherein said metal film is made of one selected from molybdenum, titanium, tantalum, tungsten, platinum, palladium, cobalt and aluminum.

* * * * *